(12) United States Patent
Brand et al.

(10) Patent No.: US 10,109,534 B2
(45) Date of Patent: Oct. 23, 2018

(54) MULTI-THRESHOLD VOLTAGE (VT) WORKFUNCTION METAL BY SELECTIVE ATOMIC LAYER DEPOSITION (ALD)

(71) Applicant: APPLIED MATERIALS, INC., Santa Clara, CA (US)

(72) Inventors: Adam Brand, Palto Alto, CA (US); Naomi Yoshida, Sunnyvale, CA (US); Seshadri Ganguli, Sunnyvale, CA (US); David Thompson, San Jose, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/627,861

(22) Filed: Feb. 20, 2015

(65) Prior Publication Data

US 2015/0262828 A1    Sep. 17, 2015

Related U.S. Application Data

(60) Provisional application No. 61/953,332, filed on Mar. 14, 2014.

(51) Int. Cl.
*H01L 21/3205* (2006.01)
*H01L 21/8238* (2006.01)
(Continued)

(52) U.S. Cl.
CPC ........ *H01L 21/823842* (2013.01); *H01L 29/66545* (2013.01); *H01L 29/66606* (2013.01); *H01L 29/7833* (2013.01)

(58) Field of Classification Search
CPC ........ H01L 21/823842; H01L 29/7833; H01L 29/66606; H01L 29/66545; H01L 438/592;
(Continued)

(56) References Cited

U.S. PATENT DOCUMENTS

2009/0309164 A1* 12/2009 Chen ............... H01L 21/823807
257/369
2010/0013090 A1* 1/2010 Gerritsen ........ H01L 21/823418
257/734
(Continued)

FOREIGN PATENT DOCUMENTS

CN    103094213 A    5/2013

OTHER PUBLICATIONS

International Search Report and Written Opinion dated May 29, 2015 for PCT Application No. PCT/US2015/018262.
(Continued)

*Primary Examiner* — Julio J Maldonado
*Assistant Examiner* — Stanetta Isaac
(74) *Attorney, Agent, or Firm* — Moser Taboada; Alan Taboada (57) ABSTRACT

Methods for forming a multi-threshold voltage device on a substrate are provided herein. In some embodiments, the method of forming a multi-threshold voltage device may include (a) providing a substrate having a first layer disposed thereon, wherein the substrate comprises a first feature and a second feature disposed within the first layer; (b) depositing a blocking layer atop the substrate; (c) selectively removing a portion of the blocking layer from atop the substrate to expose the first feature; (d) selectively depositing a first work function layer atop the first feature; (e) removing a remainder of the blocking layer to expose the second feature; and (f) depositing a second work function layer atop the first work function layer and the second feature.

20 Claims, 6 Drawing Sheets

(51) Int. Cl.
*H01L 29/66* (2006.01)
*H01L 29/78* (2006.01)

(58) Field of Classification Search
CPC ........... H01L 438/589; H01L 27/10823; H01L 27/10876; H01L 29/42336; H01L 29/42352; H01L 29/4236; H01L 29/66704; H01L 29/66734; H01L 29/7397
USPC ................ 438/592, 589, 669, 671, 674, 641
See application file for complete search history.

(56) References Cited

U.S. PATENT DOCUMENTS

| | | |
|---|---|---|
| 2010/0219484 A1 | 9/2010 | Li |
| 2010/0270627 A1* | 10/2010 | Chang ............... H01L 21/28247 257/411 |
| 2010/0320545 A1 | 12/2010 | Jagannathan et al. |
| 2010/0330810 A1 | 12/2010 | Chen et al. |
| 2011/0248351 A1 | 10/2011 | Chiang et al. |
| 2013/0075827 A1* | 3/2013 | Lee ..................... H01L 29/4966 257/369 |
| 2013/0082332 A1 | 4/2013 | Liu et al. |
| 2013/0341722 A1* | 12/2013 | Illgen ..................... H01L 21/84 257/351 |
| 2014/0001570 A1 | 1/2014 | Brodsky et al. |

OTHER PUBLICATIONS

Lin, C-H., et al. "Channel doping impact on FinFETs for 22nm and beyond." VLSI Technology (VLSIT), 2012 Symposium on. IEEE, 2012.

Auth, C., et al. "A 22nm high performance and low-power CMOS technology featuring fully-depleted tri-gate transistors, self-aligned contacts and high density MIM capacitors." VLSI Technology (VLSIT), 2012 Symposium on. IEEE, 2012.

Search Report for Taiwan Invention Patent Application No. 104105892 dated Jun. 5, 2018.

* cited by examiner

MULTI-THRESHOLD VOLTAGE (VT) WORKFUNCTION METAL BY SELECTIVE ATOMIC LAYER DEPOSITION (ALD)

CROSS-REFERENCE TO RELATED APPLICATIONS

This application claims benefit of U.S. provisional patent application Ser. No. 61/953,332, filed Mar. 14, 2014, which is herein incorporated by reference in its entirety.

FIELD

Embodiments of the present disclosure generally relate to methods of forming semiconductor devices.

BACKGROUND

Current complementary metal-oxide-semiconductor (CMOS) devices typically use metal gate materials to control transistor threshold voltage through the effective work function of a multi-layer metal stack. Different threshold voltages in a selected CMOS device may be achieved by changing the material and/or layer thickness of the metal gate stack to achieve the selected threshold voltage in each device. The current method of achieving multiple threshold voltages is a hybrid of selective well and halo implants and spatial control of the metal gate stack. While photo-patterning of well and halo implants is effective, continued fin width reduction is reducing the effectiveness of the well and halo implants, while the process remains intrinsically variable due to random dopant fluctuations. Spatial control of a metal gate stack can be achieved through a combination of photopatterning and etching in order to differentiate between n-type metal oxide semiconductor (NMOS) devices and p-type metal oxide semiconductor (PMOS) devices. However, the selective etching of the spatial control process uses an added etch stop layer, which consumes critical space in short gate length devices. Furthermore, the higher aspect ratio metal gate structures for future CMOS devices will utilize very high selectivity for removal of unwanted metal gate layers, which may render current methods impractical.

Accordingly, the inventors have developed improved methods of forming semiconductor devices.

SUMMARY

Methods and apparatus for forming a multi-threshold voltage device on a substrate are provided herein. In some embodiments, a method of forming a multi-threshold voltage device includes: (a) providing a substrate having a first layer disposed thereon, wherein the substrate comprises a first feature and a second feature disposed within the first layer; (b) depositing a blocking layer atop the substrate; (c) selectively removing a portion of the blocking layer from atop the substrate to expose the first feature; (d) selectively depositing a first work function layer atop the first feature; (e) removing a remainder of the blocking layer to expose the second feature; and (f) depositing a second work function layer atop the first work function layer and the second feature.

In some embodiments, a method of forming a multi-threshold voltage device includes: (a) providing a substrate having a first layer disposed thereon, wherein the substrate comprises a first feature and a second feature disposed within the first layer; (b) depositing a carbon-containing layer atop the substrate via a spin-on process, wherein the carbon-containing layer has a thickness of about 5 to about 200 nm; (c) selectively removing a portion of the carbon-containing layer from atop the substrate to expose the first feature; (d) selectively depositing a first work function layer atop the first feature via an atomic layer deposition process, wherein the first work function layer has a thickness of about 0.5 nm to about 4 nm; (e) removing a remainder of the carbon-containing layer to expose the second feature; and (f) depositing a second work function layer atop the first work function layer and the second feature via an atomic layer deposition process, wherein the second work function layer has a thickness of about 0.5 nm to about 4 nm.

In some embodiments, a computer readable medium is provided having instructions stored thereon that, when executed, cause a method to be performed for forming a multi-threshold voltage device. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming semiconductor devices on substrates are disclosed herein. In some embodiments, the inventive methods may advantageously be used provide multi-threshold voltage control in different device structures, including, for example, a complementary metal oxide semiconductor (CMOS) FinFet device, a planar CMOS device, and a Gate-All-Around (GAA) CMOS device. In some embodiments, the inventive methods may facilitate one or more of increased process throughput by reducing the number of process steps (i.e. eliminating the need for an etch stop layer), reduced etch selectivity concerns, and more precise layer thickness control as compared to conventional processes. In addition, the inventive methods may allow thinner layers to be used to facilitate the further scaling down of the device structures (e.g., reduction in size).

Figure 1:
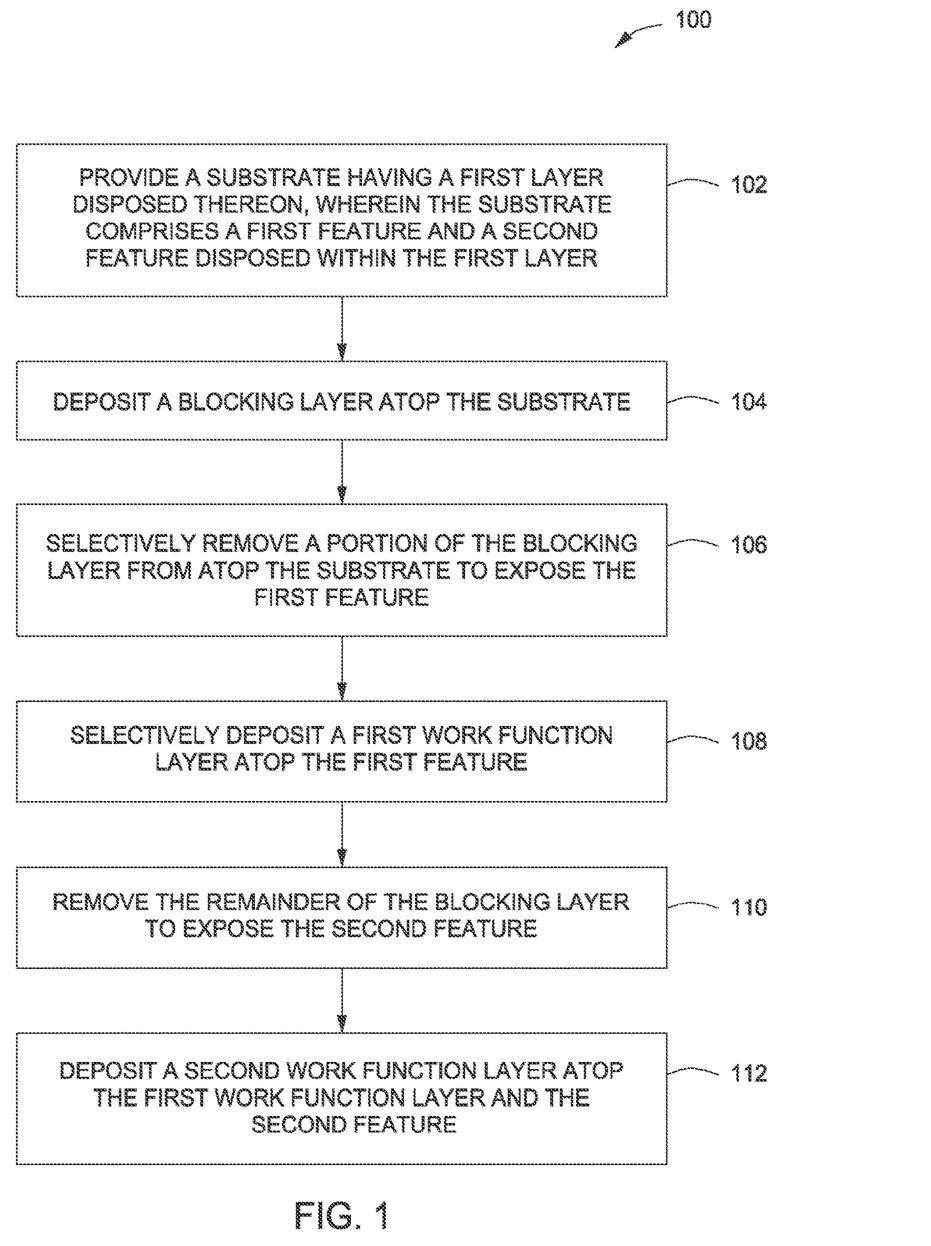
FIG. 1 depicts a flow chart for a method of forming a device in accordance with some embodiments of the present disclosure.

FIG. 1 depicts a method 100 for forming a semiconductor device in accordance with some embodiments of the present disclosure. The method 100 is described below in accordance with the stages of fabrication of a semiconductor device (device 200) depicted in FIGS. 2A-2G.

Figure 2A:
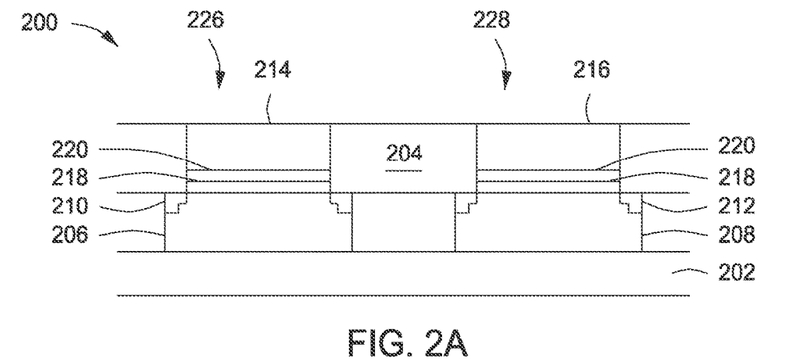
FIGS. 2A-G depicts the stages of fabrication of a device in accordance with some embodiments of the present disclosure.

The method 100 begins at 102, by providing a substrate 202, as depicted in FIG. 2A having a first layer 204 disposed thereon. The substrate 202 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer (e.g., a 200 mm, 300 mm, or the like silicon wafer), such as a doped or undoped polysilicon wafer, a doped or undoped silicon wafer, a patterned or non-patterned wafer, or the like. In some embodiments, the first layer 204 may comprise an oxide layer. In some embodiments, the substrate 202 comprises a p-type conductivity well 206 and/or an n-type conductivity well 208 and respective source/drain regions 210, 212.

In some embodiments, such as where one or more devices are to be formed on the substrate 202, a plurality of field isolation regions (not shown) may be formed in the substrate 202 to isolate conductivity wells having different conductivity types (e.g., n-type or p-type) and/or to isolate adjacent transistors. The field isolation regions may be shallow trench isolation (STI) structures formed, for example, by etching a trench into the substrate 202 and then filling the trench with a suitable insulator, such as silicon oxide (oxide), silicon nitride (nitride), or the like.

The first layer 204 comprises a first feature 226 formed in the first layer 204 defining a first device 214 formed atop the p-type conductivity well 206 and a second feature 228 formed within the first layer 204 defining a second device 216 formed atop the n-type conductivity well 208. In some embodiments, the first feature 226 and second feature 228 may be a trench or a via. In some embodiments, the first feature 226 and second feature 228 may have a height of about 100 nm and a width of about 5 nm to about 20 nm. In some embodiments, the first and second devices 214, 216 each comprise a dielectric layer 218, and a barrier layer 220 disposed atop the dielectric layer 218.

In some embodiments, the dielectric layer 218 may be formed from a single deposited layer that is subsequently patterned, or that is simultaneously deposited into a patterned region, to define the dielectric layer 218. In some embodiments, the dielectric layer 218 may comprise a dielectric material having a dielectric constant of about 3.9. In some embodiments, the dielectric layer 218 may include one or more dielectric materials, such as at least one of silicon dioxide ($SiO_2$) silicon oxynitride (SiON), or other suitable dielectric materials. In some embodiments the dielectric layer 218 may comprise a high-k material, such as a material having a dielectric constant greater than about 3.9. For example, the high-K dielectric material may be hafnium oxide (HfO2), hafnium silicon oxide (HfSiOx), hafnium silicon oxynitride (HfSiNOx), or the like.

Figure 2B:
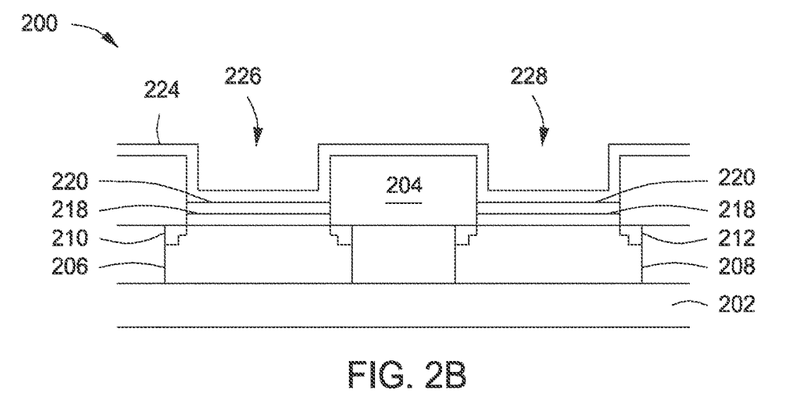

In some embodiments, the barrier layer 220 may comprise for example tantalum nitride (TaN) or titanium nitride (TiN) having any suitable thickness for use in a device 200, for example a thickness of up to about 40 angstroms. In some embodiments, the first and second devices 214, 216 each comprise a polycrystalline material (not shown), for example polycrystalline silicon, disposed atop the barrier layer 220. The polycrystalline material is etched via any suitable etching process, such as a plasma etching process, to expose the upper surface of the barrier layer 220, as shown in FIG. 2B. The polycrystalline material may be etched to expose the upper surface of the barrier layer 220 disposed atop the p-type conductivity well 206 and the upper surface of the barrier layer 220 disposed atop the n-type conductivity well 208.

In some embodiments, the substrate 202 may be exposed to a process gas comprising fluorine (F) or chlorine (Cl) to facilitate etching the polycrystalline material. In some embodiments, a plasma may be formed from the process gas. Ions from the plasma may be directed toward the substrate 202 to etch the polycrystalline material.

At 104, and as depicted in FIG. 2B, a blocking layer 224 is deposited atop the first and second feature 226, 228 of the substrate 202. In some embodiments, the blocking layer 224 has a thickness of about 1 nm to about 200 nm. In some embodiments, the blocking layer 224 may fill the first and second feature 226, 228. The blocking layer 224 is composed of any material suitable for preventing or delaying the formation of a subsequently deposited work function layer thereon, as described at 108 below. In some embodiments, the blocking layer 224 is a carbon-containing layer. In some embodiments, the carbon-containing layer is, for example, an amorphous carbon hard mask layer. The carbon-containing layer may be deposited via any process suitable to deposit a carbon-containing layer having the selected characteristics (e.g., composition, uniformity, or the like). For example, the carbon-containing layer may be deposited via a spin-on coating process, a chemical vapor deposition (CVD) process, or an atomic layer deposition (ALD) process. Exemplary spin on carbon films with a high decomposition temperature used in patterning and planarization may be used. An example of a suitable CVD deposited carbon film includes APF™, from Applied Materials, Inc. of Santa Clara, Calif. Alternatively, in some embodiments, the blocking layer 224 is an oxygen-containing layer for example, a silicon oxide ($SiO_x$) layer or a silicon oxynitride (SiON) layer. The oxygen-containing layer may be deposited via any process suitable to deposit an oxygen-containing layer having the selected characteristics (e.g., composition, uniformity, or the like). For example, the oxygen-containing layer may be deposited via a chemical vapor deposition or atomic layer deposition process. In some embodiments, the blocking layer 224 is a silicon (Si) layer, or a silicon nitride (SiN) layer, an aluminum nitride (AlN) layer, or the like.

Figure 2C:
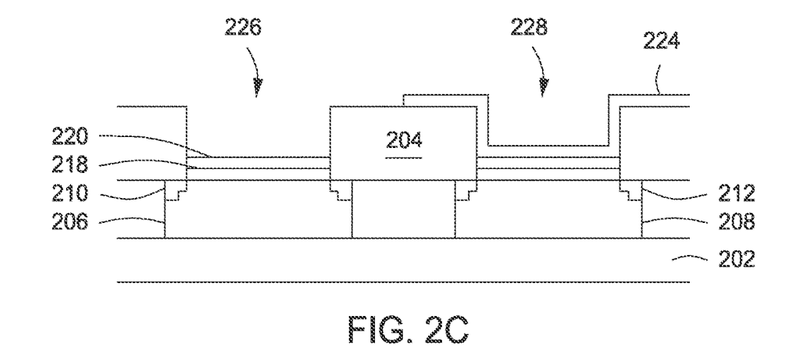

At 106, and as depicted in FIG. 2C, a portion of the blocking layer 224 is selectively removed from atop the substrate to expose the first feature 226. In embodiments, where the blocking layer 224 is a carbon-containing layer, the blocking layer may be removed using conventional techniques to remove carbon-containing films from substrates, for example ashing techniques or etching techniques. In some embodiments, the blocking layer 224 may be etched using an suitable oxygen containing plasma (e.g., $O_2$, $CO_2$, or the like), a suitable hydrogen-containing plasma (e.g., $H_2$, $NH_3$, or the like), a suitable nitrogen-containing plasma (e.g., $N_2$, $NH_3$, or the like), combinations thereof (e.g., $H_2/N_2$, or the like), or the like. In some embodiments a patterned layer such as a mask layer or anti-reflective coating (ARC) may be deposited atop the blocking layer 224 to create a pattern for selective etching. Such masking materials may include, for example, one or more of a photoresist, silicon nitride ($Si_3N_4$), or silicon oxide ($SiO_2$).

Figure 2D:
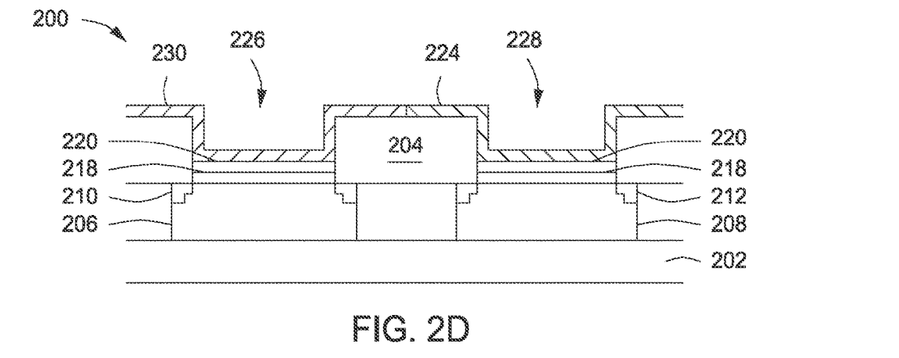

At 108, as depicted in FIG. 2D, a first work function layer 230 is selectively deposited atop the first feature 226. The first work function layer 230 may comprise any suitable metal, metal alloy or metal-containing material capable of functioning with the device 200 to produce a chosen threshold voltage of the device. Exemplary metals, metal alloys or metal-containing materials that may comprise the first work function layer 230 may include one or more titanium nitride (TiN), titanium aluminum (TiAl), titanium aluminum carbide (TiAlC), tantalum aluminum (TaAl), tantalum nitride (TaN), tantalum aluminum carbide (TaAlC), tungsten (W), or cobalt (Co). In some embodiments, the first work function layer 230 has a thickness of about 0.5 nm to about 4 nm.

In some embodiments, the first work function layer 230 is deposited via a CVD (Chemical Vapor Deposition) or an ALD (atomic layer deposition process). The substrate 202 is exposed to a precursor gas that selectively deposits the first work function layer 230 atop the first portion of the substrate but not atop the blocking layer 224. In some embodiments, the precursor gas is a metal organic compound or metal inorganic compound with a vapor pressure of greater than about 0.1 mTorr at about 200 degrees Celsius and comprising one of, or at least one of, tungsten (W), molybdenum (Mo), niobium (Nb), cobalt (Co), nickel (Ni), vanadium (V), aluminum (Al), or ruthenium (Ru). For example, in some embodiments, the precursor gas is one of $WCl_5$, $Cp'_2WH_2$, $Cp'W(CO)_3H$, $Cp'W(CO)_2NO$, $(RN)_2(R'_2N)_2W$, $WOCl_4$, $Cp'_2MoH_2$, $Cp'Mo(CO)_3H$, $Cp'Mo(CO)_2NO$, $(RN)_2(R'_2N)_2Mo$, $MoOCl_4$, $(RN)(R'_2N)_3Nb$, $NbCl_5$, $Cp_2NbH_3$, $CpNb(CO)_4H$, $Cp(allyl)Nb(CO)$, where R and R' are each independently selected from H, alkyl (2-5) and where Cp' is $R_1R_2R_3R_4R_5Cp$ where each R is independently selected from H, alkyl, alkene, or the like. For example, in some embodiments, where the first work function layer is cobalt, suitable precursor gases may include cobalt carbonyl complexes, cobalt amidinate compounds, cobaltocene compounds $(Co(C_5H_5)_2)$, cobalt dienyl complexes, cobalt nitrosyl complexes, derivatives thereof, complexes thereof, plasmas thereof, or combinations thereof. For example, in some embodiments, dicobalt hexacarbonyl acetyl compounds may be used as a precursor to form a cobalt work function layer. Alternatively, in some embodiments where the first work function layer is tungsten a suitable precursor gas may include tungsten hexafluoride ($WF_6$), tungsten hexachloride ($WCl_6$), tungsten carbonyl ($W(CO)_6$), bis(cyclopentadienyl)tungsten dichloride ($Cp_2WCl_2$), mesitylene tungsten tricarbonyl ($C_9H_{12}W(CO)_3$), or derivatives thereof. Alternatively, in some embodiments where the first work function layer is nickel a suitable precursor gas may include nickel carbonyl complexes, nickel amidinate compounds, nickelocene compounds ($Ni(C_5H_5)_2$), nickel dienyl complexes, nickel nitrosyl complexes, derivatives thereof, complexes thereof, plasmas thereof, or combinations thereof. Alternatively, in some embodiments where the first work function layer is ruthenium a suitable precursor gas may include ruthenium carbonyl complexes, ruthenium amidinate compounds, ruthenium ocene compounds ($Ru(C_5H_5)_2$), ruthenium dienyl complexes, ruthenium nitrosyl complexes derivatives thereof, complexes thereof, plasmas thereof, or combinations thereof. In some embodiments, for example when depositing a work function layer using a chloride precursor, the addition of a hydrogen chloride gas can inhibit deposition of the work function layer atop the blocking layer.

Figure 2E:
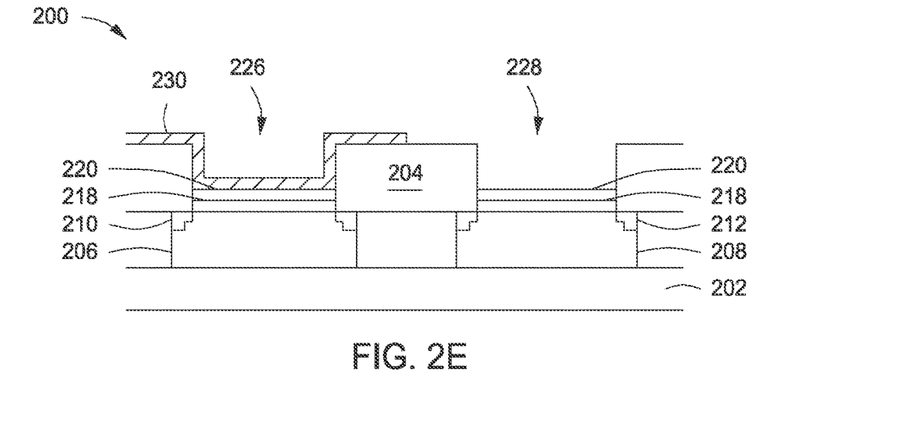

At 110, as depicted in FIG. 2E, the remainder of the blocking layer 224 is removed to expose the second feature 228. As described above, the blocking layer may be removed using conventional techniques to remove carbon-containing films from substrates, for example ashing techniques or etching techniques. In some embodiments, the blocking layer 224 may be etched using an oxygen containing plasma (e.g., $O_2$, $CO_2$, or the like), a hydrogen-containing plasma (e.g., $H_2$, $NH_3$, or the like), combinations thereof, or the like. In some embodiments, during deposition of the first work function layer 230 at 108, a thin layer of the first work function layer 230 may form atop the portion of the blocking layer 224 covering the second feature 228. In such embodiments, the portion of the first work function layer 230 formed atop the portion of the blocking layer 224 covering the second feature 228 may be etched, for example using conventional plasma etching techniques, prior to etching the portion of the blocking layer 224 covering the second feature 228.

Figure 2F:
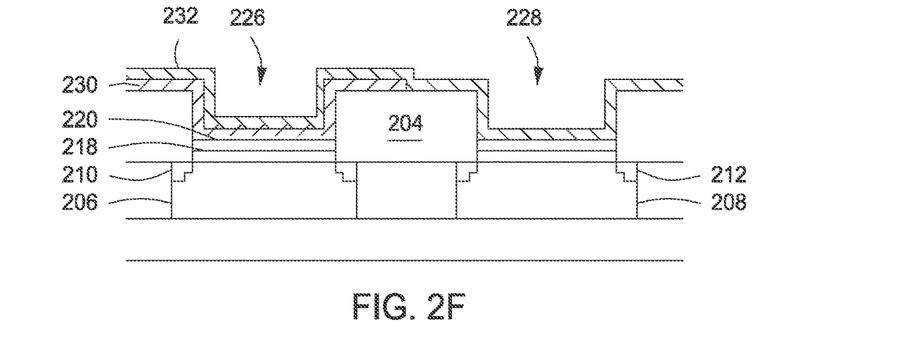

At 112, and as depicted in FIG. 2F, a second work function layer 232 is deposited atop the first work function layer 230 and the second feature 228. The second work function layer 232 may comprise any suitable metal, metal alloy or metal-containing material capable of functioning with the device 200 to produce a chosen threshold voltage of the device. Exemplary metals, metal alloys or metal-containing materials that may comprise the first work function layer 230 or the second work function layer 232 may include one or more titanium nitride (TiN), titanium aluminum (TiAl), titanium aluminum carbide (TiAlC), tantalum aluminum (TaAl), tantalum nitride (TaN), tantalum aluminum carbide (TaAlC), tungsten (W), or cobalt (Co). In some embodiments, the second work function layer 232 has a thickness of about 0.5 nm to about 4 nm, or about 0.5 nm to about 10 nm. The second work function layer 232 is different from the first work function layer 230 (e.g., the first work function layer 230 may be TiN and the second work function layer may be TaAl).

In some embodiments, the second work function layer 232 may be deposited via an atomic layer deposition process. For example, the substrate 202 may be exposed to a precursor gas selected to deposit the second work function layer 232 atop the first work function layer 230 and the second feature 228 of the first portion of the substrate 202. In some embodiments, the second precursor gas is a metal organic compound or metal inorganic compound with a vapor pressure of greater than about 0.1 mTorr at about 200 degrees Celsius and comprising one of, or at least one of, tungsten (W), molybdenum (Mo), niobium (Nb), cobalt (Co), nickel (Ni), vanadium (V), aluminum (Al), or ruthenium (Ru). For example, in some embodiments, the precursor gas is one of WCl5, $Cp'_2WH_2$, $Cp'W(CO)_3H$, $Cp'W(CO)_2NO$, $(RN)_2(R'_2N)_2W$, $WOCl_4$, $Cp'_2MoH_2$, $Cp'Mo(CO)_3H$, $Cp'Mo(CO)_2NO$, $(RN)_2(R'_2N)_2Mo$, $MoCl_4$, $(RN)(R'_2N)_3Nb$, $NbCl_5$, $Cp_2NbH_3$, $CpNb(CO)_4H$, $Cp(allyl)Nb(CO)$, where R and R' are each independently selected from H, alkyl (2-5) and where Cp' is $R_1R_2R_3R_4R_5Cp$ where each R is independently selected from H, alkyl, alkene, or the like. For example, where the second work function layer 232 is cobalt, suitable precursor gases may include cobalt carbonyl complexes, cobalt amidinate compounds, cobaltocene compounds ($Co(C_5H_5)_2$), cobalt dienyl complexes, cobalt nitrosyl complexes, derivatives thereof, complexes thereof, plasmas thereof, or combinations thereof. For example, in some embodiments, dicobalt hexacarbonyl acetyl compounds may be used as a precursor to form a cobalt work function layer. Alternatively, where the second work function layer 232 is tungsten a suitable precursor gas may include tungsten hexafluoride ($WF_6$), tungsten hexachloride ($WCl_6$), tungsten carbonyl ($W(CO)_6$), bis(cyclopentadienyl)tungsten dichloride ($Cp_2WCl_2$), mesitylene tungsten tricarbonyl ($C_9H_{12}W(CO)_3$), or derivatives thereof.

Alternatively, in some embodiments where the second work function layer is nickel a suitable precursor gas may include nickel carbonyl complexes, nickel am idinate compounds, nickelocene compounds $(Ni(C_5H_5)_2)$, nickel dienyl complexes, nickel nitrosyl complexes, derivatives thereof, complexes thereof, plasmas thereof, or combinations thereof. Alternatively, in some embodiments where the second work function layer is ruthenium a suitable precursor gas may include ruthenium carbonyl complexes, ruthenium amidinate compounds, ruthenium ocene compounds $(Ru(C_5H_5)_2)$, ruthenium dienyl complexes, ruthenium nitrosyl complexes derivatives thereof, complexes thereof, plasmas thereof, or combinations thereof. In some embodiments, the precursor gas may be a combination of a metal chloride, such as tungsten chloride $(WCl_5)$ or tantalum chloride (TaCl), and a silicon containing gas, such as silane $(SiH_4)$. In some embodiments, the second work function layer 232 has a thickness of about 0.5 nm to about 4 nm, or about 0.5 nm to about 10 nm. Additional work function layers may be also deposited to meet a selected threshold voltage of the device.

Figure 2G:
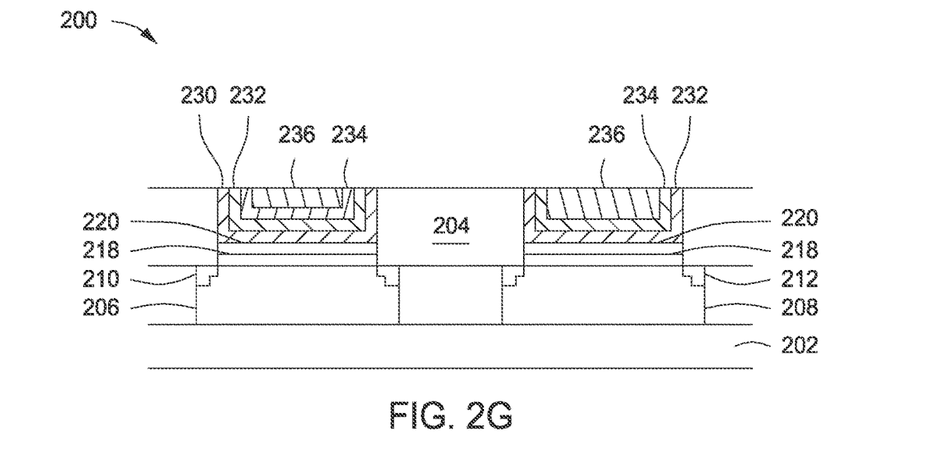

104 to 110 of method 100 may be repeated as necessary to obtain a first selected work function in the first feature and a second selected work function in the second feature. Following formation of the work function layers 230, 232 having the selected work functions, additional layers may be deposited as necessary within the features 226, 228 to complete formation of the device 200. For example, as depicted in FIG. 2G, a work function cap layer 234, composed of for example TiN, may be deposited within the features 226, 228 to prevent oxidation of the work function layers 230, 232. Following deposition of the work function cap layer, a fill layer 236 may be deposited in the features 226, 228. The fill layer may be a conductive material, such as aluminum (Al), titanium aluminum (TiAl), cobalt aluminum (CoAl), tungsten (W) or the like.

Figure 4:
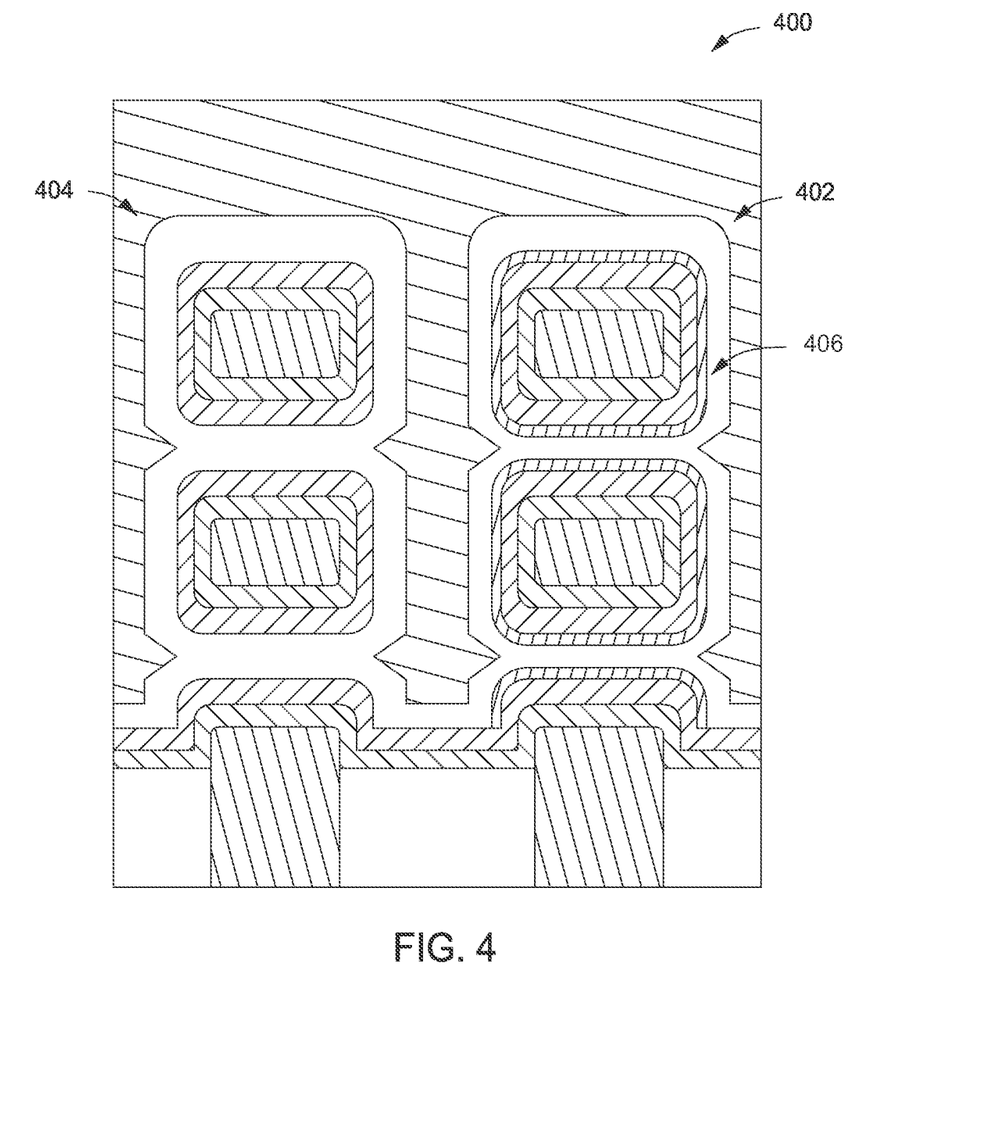
FIG. 4 depicts a gate-all-around device structure in accordance with some embodiments of the present disclosure.

In some embodiments, the final device 200, as depicted in FIG. 2G is a planar FinFet structure. In some embodiments, the method 100 may be used to form a suitable Gate-All-Around (GAA) device structure known in the art, for example a Gate-All-Around (GAA) device structure 400 as depicted in FIG. 4, having a first feature 402 and a second feature 404, where the first feature 402 has a first selected work function metal layer 406.

Figure 3:
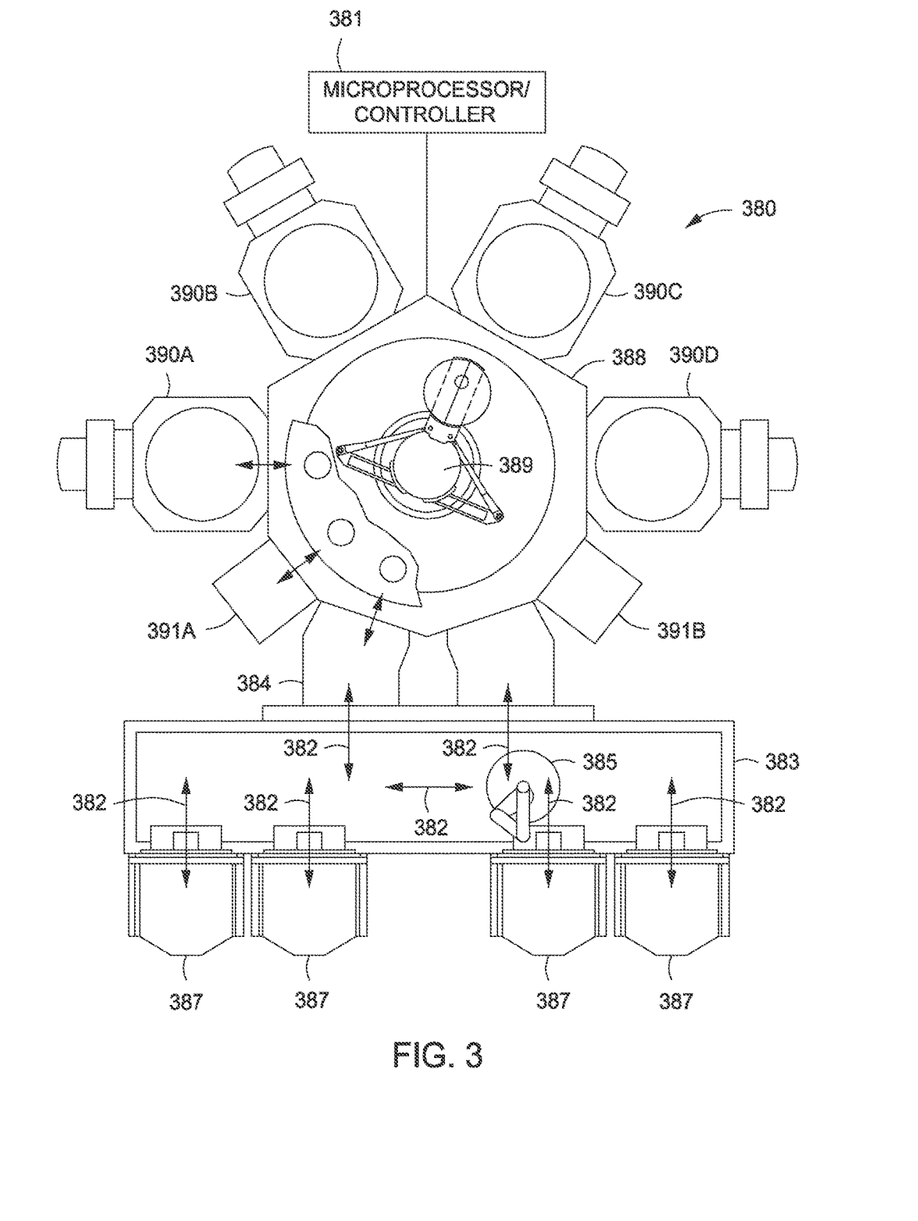
FIG. 3 depicts a cluster tool suitable for performing portions of the present disclosure in accordance with some embodiments of the present disclosure.

FIG. 3 depicts a cluster tool suitable for performing portions of the methods of the present disclosure. Generally, the cluster tool is a modular system comprising multiple chambers (e.g., process chambers 390A-D, service chambers 391A-B, or the like) which perform various functions including substrate cleaning, substrate center-finding and orientation, degassing, annealing, deposition and/or etching. In some embodiments, the cluster tool may include at least an etching apparatus and an atomic layer deposition or chemical vapor deposition apparatus configured to perform the method 100 of forming a multi-threshold voltage device as described above. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 380 is shown in a plan view in FIG. 3. The cluster tool 380 generally comprises a plurality of chambers and robots and is preferably equipped with a microprocessor controller 381 programmed to carry out the various processing methods performed in the cluster tool 380. A front-end environment 383 is shown positioned in selective communication with a pair of load lock chambers 384. A pod loader 385 disposed in the front-end environment 383 is capable of linear and rotational movement (arrows 382) to shuttle cassettes of substrates between the load locks 384 and a plurality of pods 387 which are mounted on the front-end environment 383. The load locks 384 provide a first vacuum interface between the front-end environment 383 and a transfer chamber 388. Two load locks 384 are provided to increase throughput by alternatively communicating with the transfer chamber 388 and the front-end environment 383. Thus, while one load lock 384 communicates with the transfer chamber 388, a second load lock 384 communicates with the front-end environment 383. A robot 389 is centrally disposed in the transfer chamber 388 to transfer substrates from the load locks 384 to one of the various processing chambers 390A-D and service chambers 391A-B.

In some embodiments, the method 100 of forming a multi-threshold voltage device as described above may be performed within one or more of the processing chambers 390A-D. At least one of the processing chambers (for example, 390A) may be an atomic layer deposition or chemical vapor deposition apparatus that performs a process on a substrate leading to deposition of the blocking layer 224 and/or the deposition of a work function layer 230, 232. At least one of the processing chambers (for example, 390B) may be a plasma etch chamber that performs a process on a substrate leading to removal of some or all of the blocking layer 224.

While the foregoing is directed to embodiments of the present disclosure, other and further embodiments may be devised without departing from the basic scope thereof.

The invention claimed is:

1. A method of forming a multi-threshold voltage device, comprising:
    (a) providing a substrate having a first layer disposed thereon, wherein the substrate comprises a first feature and a second feature disposed within the first layer;
    (b) depositing a blocking layer atop the substrate, the first feature, and the second feature;
    (c) selectively removing a portion of the blocking layer from atop the substrate to expose the first feature;
    (d) subsequently, selectively depositing a first work function layer atop the first feature but not atop a remainder of the blocking layer;
    (e) removing the remainder of the blocking layer to expose the second feature; and
    (f) depositing a second work function layer atop the first work function layer and the second feature.

2. The method of claim 1, wherein the blocking layer is one of a carbon-containing layer or an oxygen-containing layer.

3. The method of claim 2, wherein the carbon-containing layer is an amorphous carbon hard mask layer.

4. The method of claim 2, wherein the carbon-containing layer is deposited via one of a spin-on coating process, chemical vapor deposition process, or atomic layer deposition process.

5. The method of claim 1, wherein the blocking layer has a thickness of about 5 to about 200 nm.

6. The method of claim 1, wherein the first work function layer has a thickness of about 0.5 nm to about 10 nm, and wherein the second work function layer has a thickness of about 0.5 nm to about 10 nm.

7. The method of claim 1, wherein removing a portion of the blocking layer further comprises patterning the blocking layer using a plasma formed from one of an oxygen containing gas or a hydrogen containing gas.

8. The method of claim 1, further comprising depositing the first work function layer via an atomic layer deposition process.

9. The method of claim 8, further comprising exposing the substrate to one or more precursor gases to selectively deposit the first work function layer atop the first feature.

10. The method of claim 9, further comprising exposing the blocking layer to a first gas that delays formation of the first work function layer atop the blocking layer.

11. The method of claim 10, wherein the first gas is hydrogen chloride.

12. The method of claim 9, wherein the precursor gas comprises one of tungsten, molybdenum, niobium, cobalt, nickel, vanadium, aluminum, or ruthenium.

13. The method of claim 1, wherein depositing the second work function layer further comprises exposing the substrate to a second precursor gas.

14. The method of claim 13, wherein the second precursor gas comprises one of tungsten, molybdenum, niobium, cobalt, nickel, vanadium, aluminum, or ruthenium.

15. The method of claim 1, repeating (b)-(f) to obtain a first selected work function in the first feature and a second selected work function in the second feature.

16. The method of claim 1, wherein the first feature and second feature are each formed atop a first conductivity well and a second conductivity well.

17. A method of forming a multi-threshold voltage device, comprising:
   (a) providing a substrate having a first layer disposed thereon, wherein the substrate comprises a first feature and a second feature disposed within the first layer;
   (b) depositing one of a carbon-containing layer or an oxygen-containing layer atop the substrate, the first feature, and the second feature, wherein the carbon-containing layer or the oxygen-containing layer has a thickness of about 1 to about 200 nm;
   (c) selectively removing a portion of the carbon-containing layer or oxygen-containing layer from atop the substrate to expose the first feature;
   (d) selectively depositing a first work function layer atop the first feature, but not atop a remainder of the carbon-containing layer or oxygen-containing layer, via an atomic layer deposition process, wherein the first work function layer has a thickness of about 0.5 nm to about 4 nm;
   (e) removing the remainder of the carbon-containing layer or oxygen-containing layer to expose the second feature; and
   (f) depositing a second work function layer atop the first work function layer and the second feature via an atomic layer deposition process, wherein the second work function layer has a thickness of about 0.5 nm to about 4 nm.

18. The method of claim 1, wherein the second work function layer is deposited directly atop the first work function layer and the second feature.

19. The method of claim 17, wherein the second work function layer is deposited directly atop the first work function layer and the second feature.

20. A non-transitory computer readable medium having instructions stored thereon that, when executed, cause a method for forming a multi-threshold voltage device, the method comprising:
   (a) providing a substrate having a first layer disposed thereon, wherein the substrate comprises a first feature and a second feature disposed within the first layer;
   (b) depositing a blocking layer atop the substrate, the first feature, and the second feature;
   (c) selectively removing a portion of the blocking layer from atop the substrate to expose the first feature;
   (d) subsequently, selectively depositing a first work function layer atop the first feature but not atop a remainder of the blocking layer;
   (e) removing the remainder of the blocking layer to expose the second feature; and
   (f) depositing a second work function layer atop the first work function layer and the second feature.

* * * * *

UNITED STATES PATENT AND TRADEMARK OFFICE
CERTIFICATE OF CORRECTION

PATENT NO.           : 10,109,534 B2
APPLICATION NO.      : 14/627861
DATED                : October 23, 2018
INVENTOR(S)          : Brand et al.

Page 1 of 1

It is certified that error appears in the above-identified patent and that said Letters Patent is hereby corrected as shown below:

In the Specification

Column 5, Line 48, delete "nickel am idinate" and substitute therefor --nickel amidinate--;

Column 7, Line 3, delete "nickel am idinate" and substitute therefor --nickel amidinate--.

Signed and Sealed this
Twenty-ninth Day of January, 2019

Andrei Iancu
*Director of the United States Patent and Trademark Office*